(12) United States Patent
Kim et al.

(10) Patent No.: US 7,902,551 B2
(45) Date of Patent: Mar. 8, 2011

(54) LIQUID CRYSTAL DISPLAY DEVICE AND METHOD OF MANUFACTURING THE SAME

(75) Inventors: Jong-In Kim, Yongin-si (KR); Jang-Soo Kim, Yongin-si (KR); Young-Wook Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 54 days.

(21) Appl. No.: 12/332,044

(22) Filed: Dec. 10, 2008

(65) Prior Publication Data

US 2009/0315031 A1 Dec. 24, 2009

(30) Foreign Application Priority Data

Jun. 20, 2008 (KR) .................. 10-2008-0058524

(51) Int. Cl.
*H01L 33/00* (2010.01)
(52) U.S. Cl. .................. 257/59; 257/72; 257/E33.001; 257/E33.013

(58) Field of Classification Search .................. 257/59, 257/72, E33.001, E33.013
See application file for complete search history.

(56) References Cited

U.S. PATENT DOCUMENTS

| 7,462,862 | B2* | 12/2008 | Hoffman et al. | 257/43 |
| 2009/0057672 | A1* | 3/2009 | Kobayashi et al. | 257/59 |
| 2009/0315031 | A1* | 12/2009 | Kim et al. | 257/59 |
| 2010/0096635 | A1* | 4/2010 | Jung et al. | 257/59 |

* cited by examiner

*Primary Examiner* — Victor A Mandala
(74) *Attorney, Agent, or Firm* — H.C. Park & Associates, PLC

(57) ABSTRACT

The present invention relates to a liquid crystal display and a method of manufacturing the same. A liquid crystal display according to an exemplary embodiment of the present invention includes: a first substrate, a first conductor arranged on the first substrate, a first insulating layer arranged on the first substrate and the first conductor, a second insulating layer arranged on the first insulating layer, a semiconductor layer arranged on the second insulating layer, and a second conductor arranged on the semiconductor layer and the second insulating layer. The semiconductor layer is made of an oxide semiconductor, and the second conductor includes a source electrode, a drain electrode, and a storage electrode line.

14 Claims, 8 Drawing Sheets

LIQUID CRYSTAL DISPLAY DEVICE AND METHOD OF MANUFACTURING THE SAME

CROSS-REFERENCE TO RELATED APPLICATION

This application claims priority from and the benefit of Korean Patent Application No. 10-2008-0058524 filed on Jun. 20, 2008, which is hereby incorporated by reference for all purposes as if fully set forth herein.

BACKGROUND OF THE INVENTION

1. Field of the Invention

The present invention relates to a liquid crystal display and a manufacturing method thereof.

2. Discussion of the Background

A liquid crystal display (LCD) is one of the most widely used flat panel displays (FPD), and it includes two display panels on which field generating electrodes such as a pixel electrode and a common electrode are formed, and a liquid crystal layer, which is interposed between the two display panels. A voltage is applied to the field generating electrodes to generate an electric field in the liquid crystal layer, and the orientation of liquid crystal molecules in the liquid crystal layer is determined and the polarization of incident light is controlled through the generated electric field to display an image.

An LCD structure in which field generating electrodes are respectively formed on two display panels is widely used. Among the two display panels, a plurality of pixel electrodes are arranged in a matrix on one display panel, and a common electrode covers the entire surface of the other display panel. For generating images in the LCD, a separate voltage is applied to each pixel electrode. For this, a thin film transistor as a three terminal element for switching a voltage applied to the pixel electrode is connected to each pixel electrode. A gate line for transmitting a signal to control the thin film transistor and a data line for transmitting a data voltage which will be applied to the pixel electrode are provided on a display panel. The thin film transistor acts as a switching element that provides the data voltage to the pixel electrode according to the gate signal applied to the gate line.

Recently, the tendency toward large size and highly miniaturized LCDs has accelerated, and next generation processes for realization thereof are desirable. Particularly, if super high resolution and a driving frequency of 120 Hz are applied to the large size LCD, the RC delay should be reduced and the characteristics of the thin film transistor should be improved with regard to the driving of the display panel.

The above information disclosed in this Background section is only for enhancement of understanding of the background of the invention and therefore it may contain information that does not form the prior art that is already known to a person of ordinary skill in the art.

SUMMARY OF THE INVENTION

The present invention provides an LCD and a method of manufacturing the LCD that reduces the costs of the LCD.

Additional features of the invention will be set forth in the description which follows, and in part will be apparent from the description, or may be learned by practice of the invention.

The present invention discloses a liquid crystal display comprising: a first substrate; a first conductor arranged on the first substrate; a first insulating layer arranged on the first substrate and the first conductor; a second insulating layer arranged on the first insulating layer; a semiconductor layer arranged on the second insulating layer; and a second conductor arranged on the semiconductor layer and the second insulating layer, wherein the semiconductor layer comprises an oxide semiconductor and the second conductor comprises a source electrode, a drain electrode, and a storage electrode line.

The first conductor, the first insulating layer, the second insulating layer, the semiconductor layer, the source electrode, and the drain electrode may form a thin film transistor, and the source electrode, the drain electrode, and the storage electrode line may be formed with the same layer.

The storage electrode line may extends non-linearly and in an extension direction of a data line.

The liquid crystal display may further include a passivation layer arranged on the second conductor, a pixel electrode arranged on the passivation layer, and a common electrode arranged on a lower surface of a second substrate, the common electrode facing the first substrate, wherein the common electrode may have a cutout, and the storage electrode line may overlap with the cutout of the common electrode.

The liquid crystal display may further include a light blocking film disposed between the first insulating layer and the first substrate and under the storage electrode line, the light blocking film having the same pattern as the storage electrode line.

A buffer layer arranged between the first substrate and the first conductor may be further included.

The thickness of the first insulating layer may be equal to or greater than a thickness of the first conductor.

The thickness of the first conductor may be in the range of 0.5 μm to 5 μm, and the thickness of the first insulating layer may be in the range of 0.5 μm to 5 μm.

The first conductor or the second conductor may include at least one of aluminum (Al), silver (Ag), and copper (Cu).

The dielectric constant of the first insulating layer may be less than 3.5.

The first insulating layer may include an inorganic insulator or an organic insulator.

The inorganic insulator may include at least one of fluorine-doped silicon oxide ($SiO_2F$), carbon-doped silicon oxide ($SiO_2C$), hydrogen-doped silicon oxide ($SiO_2H$), porous silicon oxide (porous $SiO_2$), porous carbon silicon oxide (porous $SiO_2C$), and highly porous oxides.

The organic insulator may include at least one of hydrogen silsesquioxane (HSQ), methylsilsesquioxane, polyimide, polynorbornenes, benzocyclobutene, aromatic polymers, vapor-deposited parylene, parylene-F, fluorine doped amorphous carbon, and polytetrafluoroethylene (PTFE).

The oxide semiconductor of the semiconductor layer may include at least one of Zn oxide, Ga oxide, Sn oxide, In oxide, InGaZnO4, Zn—In—O, and Zn—Sn—O.

The present invention also discloses a liquid crystal display manufacturing method comprising: forming a first conductor on a first substrate; depositing a first insulating layer on the first substrate and the first conductor; forming a gate insulating layer on the first insulating layer; forming a semiconductor layer on the gate insulating layer; and forming a second conductor on the semiconductor layer and the gate insulating layer, the second conductor comprising a source electrode, a drain electrode, and a storage electrode line, wherein the storage electrode line is formed of the same layer as the source electrode and the drain electrode. The storage electrode line may extend non-linearly and in an extension direction of a data line.

The method may further include forming a passivation layer on the second conductor, forming a pixel electrode on the passivation layer, and forming a common electrode on a lower surface of a second substrate, wherein the common electrode includes a cutout that overlaps with the storage electrode line when the first substrate and the second substrate are joined together.

A light blocking film having the same shape as the storage electrode line may be formed in the step of forming the first conductor.

Before the forming of the first conductor, a buffer layer may be further formed on the first substrate.

The forming of the first conductor may include depositing a metal or metal alloy containing at least one of aluminum (Al), silver (Ag), and copper (Cu) by using one of sputtering, electroplating, electroless plating, Inkjet printing, and gravure printing.

The thickness of the first conductor may be in the range of 0.5 μm to 5 μm.

The first insulating layer may comprises a material layer having a dielectric constant of less than 3.5.

The forming of the semiconductor layer and the forming of the second conductor may be formed by using a single mask.

According to the present invention, although the low dielectric insulating layer is used on the channel of the thin film transistor, deterioration of the on current may be prevented, and it is not necessary for the low dielectric insulating layer to be additionally patterned in the portion of the storage electrode such that the device cost may be reduced thereby and production may be increased.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
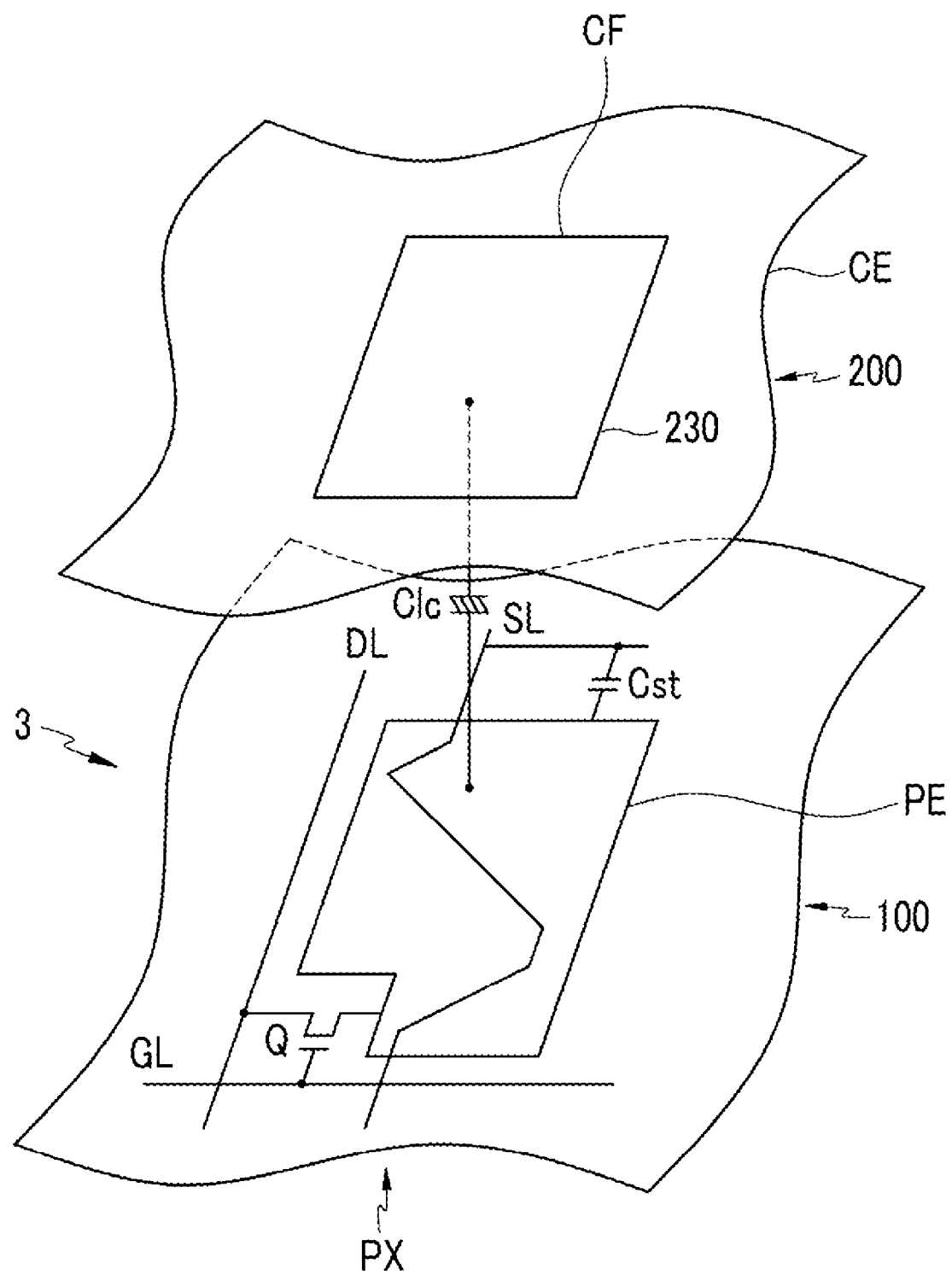
FIG. 1 is an equivalent circuit diagram of one pixel in a liquid crystal display according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

FIG. 1 is an equivalent circuit diagram of one pixel in a liquid crystal display according to an exemplary embodiment of the present invention. Referring to FIG. 1, a liquid crystal display according to the present exemplary embodiment includes a lower panel 100 and an upper panel 200 facing each other, and a liquid crystal layer 3 disposed between the display panels 100 and 200.

The lower panel 100 is provided with signal lines including a gate line GL, a data line DL and a storage electrode line SL, a switching element Q connected to the gate line GL and the data line DL, and a pixel electrode PE connected to the switching element Q. The data line DL crosses the gate line GL.

The gate line GL transmits a gate signal, the data line DL transmits a data signal, and the storage electrode line SL is applied with a predetermined voltage such as a common voltage Vcom. The storage electrode line SL is formed according to the direction of the data line DL, and is made in a zigzag shape. The storage electrode line SL is disposed at the same level as the data line DL.

The switching element Q is a three terminal element such as a thin film transistor, the control terminal of which is connected to the gate line GL, the input terminal of which is connected to the data line DL, and the output terminal of which is connected to the pixel electrode PE.

The upper panel 200 includes a common electrode CE and a color filter CF.

The common electrode CE is formed on the whole surface of the upper panel 200 and is applied with the common voltage Vcom.

For color display, each pixel PX uniquely represents one of primary colors (i.e., spatial division) or each pixel PX sequentially represents the primary colors in turn (i.e., temporal division), such that a spatial or temporal sum of the primary colors is recognized as a desired color. An example of a set of the primary colors includes red, green, and blue color. FIG. 1 shows an example of the spatial division in which each pixel PX includes a color filter CF representing one of the primary colors in an area of the upper panel 200 facing the pixel electrode PE. Alternatively, unlike as shown in FIG. 1, the color filter CF may be provided on or under the pixel electrode PE on the lower panel 100.

The liquid crystal layer 3 has negative dielectric anisotropy. Liquid crystal molecules of the liquid crystal layer 3 may be arranged such that longitudinal axes of the liquid crystal molecules are perpendicular to the surfaces of the two panels 100 and 200 in the absence of application of an electric field. Alternatively, the common electrode CE may be formed on the lower panel 100, and at least one of the two electrodes PE and CE may have a linear shape or a bar shape.

The pixel electrode PE of the lower panel 100, the common electrode CE of the upper panel 200, and the liquid crystal layer 3 form a liquid crystal capacitor Clc, with the liquid crystal layer 3 acting as a dielectric material.

A storage capacitor Cst, which serves as an auxiliary capacitor to the liquid crystal capacitor Clc is formed by overlapping the pixel electrode PE and the storage electrode line SL, with an insulator interposed between the pixel electrode PE and the storage electrode line SL.

At least one polarizer (not shown) is provided in the liquid crystal display.

In the liquid crystal display, the pixel electrode PE receives a data voltage through the data line DL, and a common voltage Vcom is applied to the common electrode CE. The difference between the voltage that is applied to the pixel PX and the common voltage Vcom is represented as a charge voltage, i.e., a pixel voltage of the liquid crystal capacitor Clc. Liquid crystal molecules in the liquid crystal layer 3 change their arrangement according to a magnitude of the pixel voltage, so that polarization of light passing through the liquid crystal layer 3 changes. A change in transmittance of light by the polarizer occurs with the change in light polarization, whereby images are displayed in the liquid crystal display.

Figure 2:
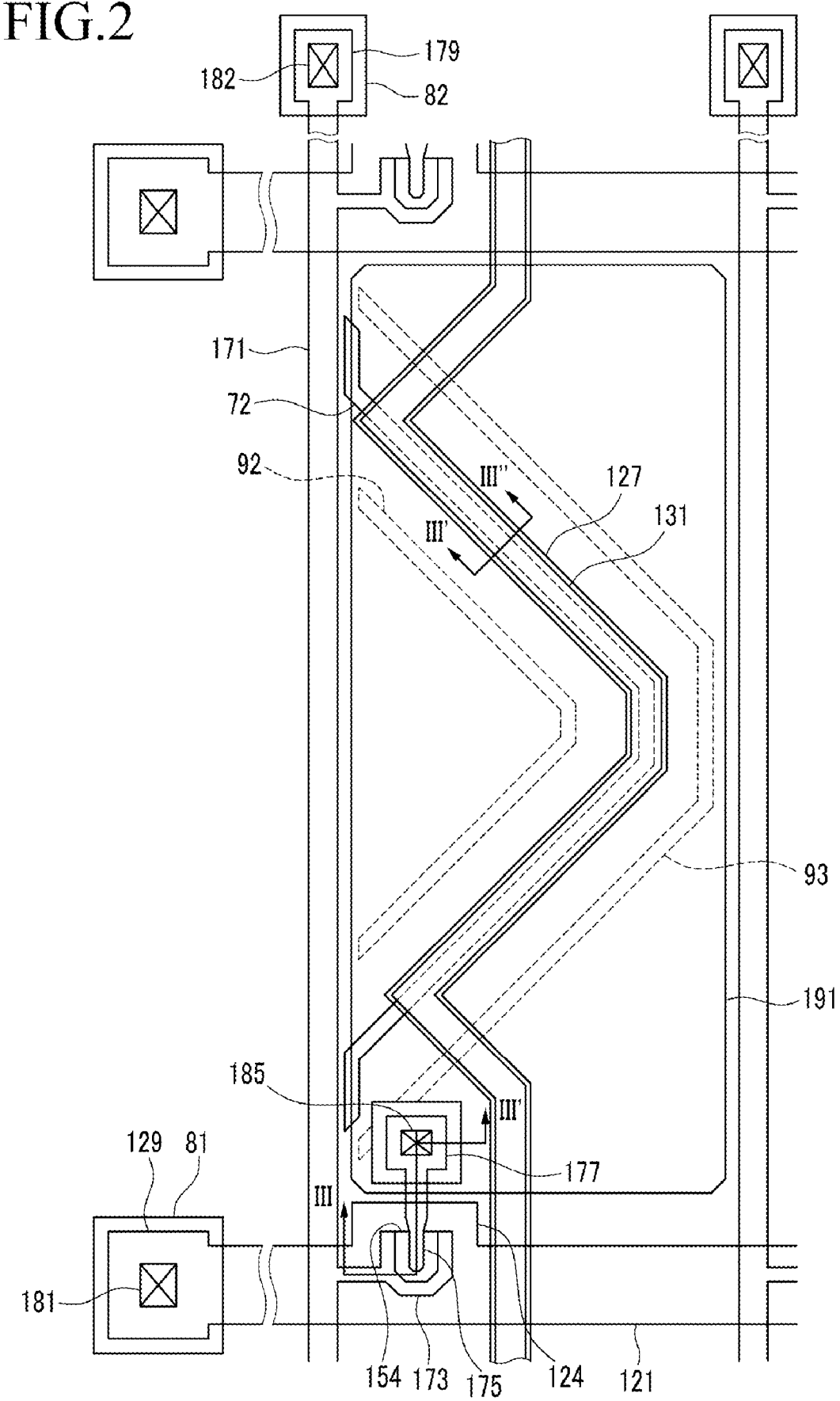
FIG. 2 is a layout view of a liquid crystal display according to an exemplary embodiment of the present invention.
Figure 3:
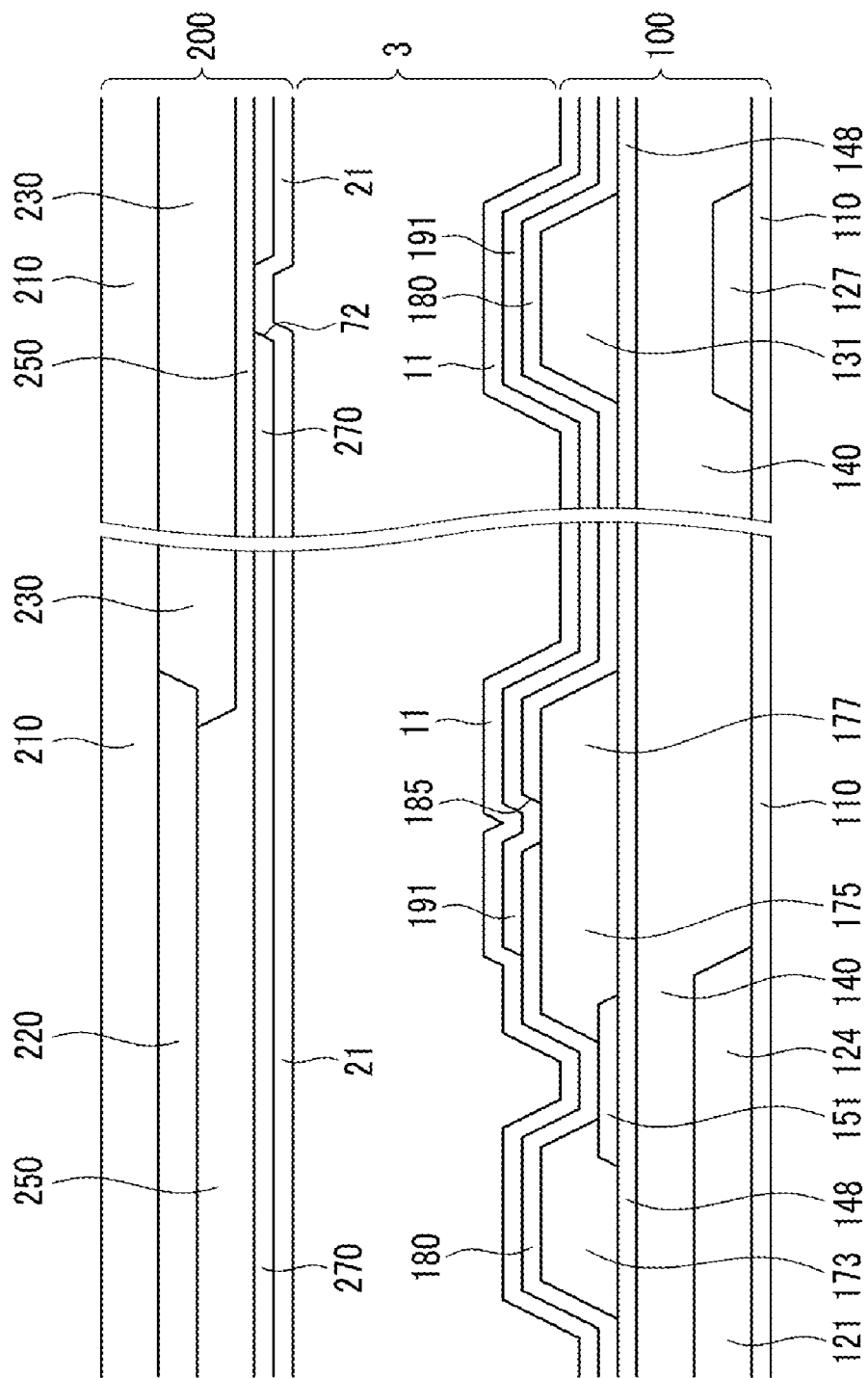
FIG. 3 is a cross-sectional view of the liquid crystal display taken along lines III-III' and III'-III" of FIG. 2.

Referring to FIG. 2 and FIG. 3, a liquid crystal display according to an exemplary embodiment of the present invention is described below.

FIG. 2 is a layout view of a liquid crystal panel assembly according to an exemplary embodiment of the present invention, and FIG. 3 is a cross-sectional view of the liquid crystal panel assembly taken along the lines III-III' and III'-III" of FIG. 2.

Referring to FIG. 2 to FIG. 3, a liquid crystal panel assembly according to the present exemplary embodiment includes the lower panel 100 and the upper panel 200, and the liquid crystal layer 3 interposed between the display panels 100 and 200.

First, the lower panel 100 will be described.

A plurality of gate conductors including a plurality of gate lines 121 are formed on an insulating substrate 110, which is may be made of transparent glass or plastic.

The gate lines 121 extend substantially in a transverse direction and transmit gate signals, and include a plurality of gate electrodes 124 protruding upward and an end portion 129 having a large area for connection with another layer or a gate driving circuit. The gate lines 121 are connected to a gate driver (not shown). The gate lines 121 may be directly connected to the gate driver if the gate driver is directly integrated on the substrate 110.

The gate lines 121 may be made of a metal having low resistance such aluminum (Al) or an aluminum alloy, silver (Ag) or a silver alloy, and a copper (Cu) or a copper alloy. The gate lines may have a multilayered structure including two conductive layers (not shown) having different physical properties, and may be made of various other metals or electric conductors.

The thickness of the gate lines 121 may be in the range of 0.5 μm to 5 μm.

A low dielectric insulating layer 140 is formed on the gate lines 121.

The low dielectric insulating layer 140 may be made of an organic insulator such as hydrogen silsesquioxane (HSQ), methylsilsesquioxane (MSQ), polyimides, polynorbornenes (PN), benzocyclobutene, aromatic polymers, vapor-deposited parylene, parylene-F, fluorine-doped amorphous carbon, and polytetrafluoroethylene (PTFE) (i.e., Teflon®). The low dielectric insulating layer 140 may also be made of an inorganic insulator such as fluorine-doped silicon oxide ($SiO_2F$), carbon-doped silicon oxide ($SiO_2C$), hydrogen-doped silicon oxide ($SiO_2H$), porous silicon oxide (porous $SiO_2$), porous carbon silicon oxide (porous $SiO_2C$), and highly porous oxides.

The low dielectric insulating layer 140 may have a dielectric constant (relative permittivity) of less than 3.5, and the surface of this layer may be planarized. When the low dielectric insulating layer 140 is made of an organic insulator, the organic insulator may have high thermal resistance.

The low dielectric insulating layer 140 has a thickness that may be in the range of 0.5 μm to 5 μm, is equal to or thicker than the gate lines 121, and has a flat surface. That is, the low dielectric insulating layer 140, having a good leveling characteristic and sufficient thickness, is deposited on the gate lines 121 such that a planarization process may be avoided. Accordingly, an increase of a step in another layer formed on the low dielectric insulating layer 140 caused by the thicker gate lines 121 is prevented, thereby avoiding a defect such as a disconnection.

A gate insulating layer 148, which may be made of silicon oxide (SiOx) or silicon nitride (SiNx) is formed on the low dielectric insulating layer 140.

A plurality of semiconductor layers 151 are formed on the gate insulating layer 148. Here, the semiconductor layers 151 are made of an oxide semiconductor. The gate insulating layer 148 is situated between the semiconductor layers 151 and the low dielectric insulating layer 140.

The oxide semiconductor has greater mobility than hydrogenated amorphous silicon (referred to as "a-Si"). Accordingly, the low dielectric insulating layer 140 may be removed in order to prevent a reduction of the on current, Ion, in portions of the thin film transistor. However, the on current Ion may be maintained according to an exemplary embodiment of the present invention even if the low dielectric insulating layer 140 is not removed under the semiconductor layers 151. Additionally, the process for patterning the low dielectric insulating layer 140 may be omitted in order to simplify the process of forming the low dielectric insulating layer 140. Further, the low dielectric insulating layer 140 is applied to the whole portion of the thin film transistors such that a reduction of the RC delay may be maximized.

The oxide semiconductor forms an ohmic contact with the metal such that it is not necessary for a N+ hydrogenated amorphous silicon layer or silicide to be formed as an ohmic contact layer, unlike the case with a-Si.

A plurality of data conductors including a plurality of data lines 171 and a plurality of drain electrodes 175 are formed on the semiconductor layers 151. Storage electrode lines 131 are disposed at the same level as the plurality of data conductors.

The data lines 171 transmit data voltages, and extend substantially in the longitudinal direction while crossing the gate lines 121. Each data line 171 includes a plurality of source electrodes 173 curved toward the gate electrodes 124 and having a "U" shape, and an end portion 179 for connecting to other layers or an external driving circuit. The data lines are connected to a data driver (not shown). The data lines 171 may be directly connected to the data driver if the data driver is directly integrated on the substrate 110.

The drain electrodes 175 face the source electrodes 173, and each includes one end portion 177 having a wide area and another end portion having a bar shape. The bar end portions are substantially enclosed by the curved portion of the source electrodes 173.

The storage electrode lines 131, which transmit the common voltage Vcom extend in the longitudinal direction of the pixel area. In this case, the number of storage electrode lines 131 is increased such that the aperture ratio of the whole panel may be reduced. Accordingly, for to prevent the reduction of the aperture ratio in the exemplary embodiment of the present invention, the storage electrode lines 131 do not have a straight shape, and are disposed corresponding to regions of cutouts 72 of a common electrode 270. Therefore, each storage electrode line 131 is disposed corresponding to a cutout 72 such that a reduction of the aperture ratio thereby may be minimized. Also, in the exemplary embodiment of the present invention, each storage electrode line 131 is formed with a zigzag shape according to the longitudinal direction of the pixel area. Therefore, the length of each storage electrode line 131 may be increased by four times compared with a straight shape formed according to the horizontal direction of the panel. Thus the width of the storage electrode line 131 may be reduced to ¼ while obtaining the same capacitance. Accordingly, reduction of the aperture ratio may be minimized compared with the conventional storage electrode structure.

A light blocking film 127 may be formed under the storage electrode lines 131. The light blocking film 127 may be disposed between the insulation substrate 110 and the low dielectric insulating layer 140 under the storage electrode lines 131. The light blocking film 127 may have the same shape as the storage electrode lines 131. When the storage electrode lines 131 are formed with the zigzag shape, light leakage due to its being at an angle of 45 degrees between the director of the liquid crystal and the polarization axis may be prevented by the light blocking film 127.

The storage electrode lines 131, data lines 171, and drain electrodes 175, which may be referred to as "data conductors," may be formed of a refractory metal such as molybdenum, chromium, tantalum, or titanium, or an alloy thereof, and may have a multi-film structure including a refractory metal film (not shown) and a low resistance conductive layer (not shown). Also, like the gate lines 121, the data conductors 131, 171, and 175 may be formed of a metal having low resistance such as aluminum (Al) or an aluminum alloy, silver (Ag) or a silver alloy, and copper (Cu) or a copper alloy.

Also, the thickness of the data conductors 131, 171, and 175 may be in the range of 0.5 µm to 5 µm like the gate lines 121. However, the data conductors 131, 171, and 175 may be made of various other metals or conductors.

In this way, the gate lines 121 and the data conductors 131, 171, and 175 are formed of the low resistance metal or have the thickness to sufficiently reduce wire resistance.

A gate electrode 124, a source electrode 173, and a drain electrode 175 form a thin film transistor (TFT) Q along with a protrusion 154 of the semiconductor layers 151, and the channel of the thin film transistor Q is formed in the portion of the protrusion 154 between the source electrode 173 and the drain electrode 175.

The semiconductor layers 151 include exposed portions that are not covered by the data lines 171 and the drain electrodes 175, and are disposed between the source electrodes 173 and the drain electrodes 175.

A passivation layer 180 is formed on the data conductors 131, 171, and 175 and the exposed semiconductor layers 151. The passivation layer 180 may be made of an inorganic insulator or an organic insulator, and may have a flat surface. The organic insulator may have a dielectric constant of less than 4.0, and be photosensitive.

The passivation layer 180 has a plurality of contact holes. Contact hole 182 exposes the end portions 179 of the data lines 171, and contact hole 185 exposes the wide end portions 177 of the drain electrodes 175. The passivation layer 180, the lower dielectric insulating layer 140, and the gate insulating layer 148 have a plurality of contact holes 181 exposing the end portions 129 of the gate lines 121.

A plurality of pixel electrodes 191 and a plurality of contact assistants 81 and 82 are formed on the passivation layer 180. The pixel electrodes 191 and contact assistants 81 and 82 may be made of a transparent conductive material such as indium tin oxide (ITO) or indium zinc oxide (IZO), or a reflective metal such as aluminum, silver, chromium, or an alloy thereof.

Each pixel electrode 191 includes a first cutout 92 and a second cutout 93, and is divided into a plurality of partitions by the cutouts 92 and 93. The cutouts 92 and 93 are substantially inversely symmetrical to a virtual transverse central line that bisects the pixel 191.

The oblique portions of the first and second cutouts 92 and 93 are substantially parallel to each other, and may form an angle of about 45 degrees with the gate lines 121.

The pixel electrodes 191 are connected to the drain electrodes 175 through the contact holes 185. Data voltages and are applied to the pixel electrodes 191 from the drain electrodes 175.

The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179, and complement the adhesion of the end portions 129 and 179 to external devices.

Next, the upper panel 200 will be described in detail.

A light blocking member 220 is formed on an insulating substrate 210, which may be made of a material such as transparent glass or plastic. The light blocking member 220 prevents light leakage between the pixel electrodes 191 and defines a plurality of openings facing the pixel electrodes 191.

A plurality of color filters 230 are formed on the substrate 210 and the light blocking member 220. The color filters 230 are disposed substantially in areas enclosed by the light blocking member 220, and may extend substantially in the longitudinal direction along a row of the pixel electrodes 191. Each color filter 230 may represent one of the primary colors, such as red, green, and blue.

An overcoat 250 may be formed on the color filters 230 and the light blocking member 220. The overcoat 250 may be made of an (organic) insulating material, and prevents the color filters 230 from being exposed and provides a flat surface. The overcoat 250 may be omitted.

A common electrode 270 is formed on the overcoat 250. The common electrode 270 may be made of a transparent conductive material, such as ITO or IZO, and it receives the common voltage Vcom.

The common electrode 270 has a cutout 72. The cutout 72 is substantially inversely symmetrical to a virtual transverse central line that bisects the pixel area. The cutout 72 has at least one oblique portion extending substantially obliquely, and each slanting portion may have a plurality of notches that are concave or convex.

At least one of the cutouts 72, 92, and 93 of the pixel electrodes 191 and the common electrode 270 may be replaced with protrusions or depressions, and the shape and arrangement thereof may be changed. Multiple cutouts 72, 92, and 93 may be formed.

Alignment layers 11 and 21 may be provided on inner surfaces of the display panels 100 and 200, and may be homeotropic alignment layers.

Polarizers (not shown) may be provided on the outer surface of the display panels 100 and 200, and the transmissive axes of the two polarizers (not shown) are crossed and one transmissive axis thereof may be parallel to the gate lines 121.

The liquid crystal layer 3 between the lower panel 100 and the upper panel 200 has negative dielectric anisotropy, and may be oriented such that the major axes of the liquid crystal molecules of the liquid crystal layer 3 are almost perpendicular to the surfaces of the two display panels 100 and 200 when no electric field is applied.

A pixel electrode 191 and the common electrode 270 form a liquid crystal capacitor Clc along with the liquid crystal layer 3 therebetween to maintain applied voltages after the thin film transistor Q (FIG. 1) turns off.

The pixel electrode 191 forms the storage capacitor Cst along with the storage electrode line 131 to enhance the voltage storing capacity of the liquid crystal capacitor Clc. In the conventional structure, the storage capacitor Cst is formed between the gate conductor and the pixel electrode. However, in an exemplary embodiment of the present invention, the storage capacitor Cst is formed between the storage electrode line 131, which is disposed at the same level as the source electrode 173 and the drain electrode 175, and the pixel electrode 191. Thus, the storage capacitor Cst is not influenced by the low dielectric insulating layer 140. Accordingly, it is not necessary for the low dielectric insulating layer 140 to be removed from the overlapping portion between the wide end 177 of the drain electrode 175 and the storage electrode line 131, thereby simplifying the process of forming the LCD. Also, the capacitance of the storage capacitor Cst may be increased in the present embodiment, thereby enhancing the voltage storing capacity.

The pixel electrodes 191, to which the data voltage is applied, generate an electric field together with the common electrode 270 that receives the common voltage, and the electric field determines the orientation of liquid crystal molecules (not shown) of the liquid crystal layer 3 between the electrodes 191 and 270. This electric field includes a vertical component that is perpendicular to the surface of the display panels 100 and 200, and a horizontal component that is parallel to the surface of the display panels 100 and 200 and perpendicular to the cutouts 72, 92, and 93. The inclined direction of the liquid crystal molecules is primarily determined depending on the horizontal component, and the tilt directions of the liquid crystal molecules may be classified into four directions. When the tilt directions of the liquid crystal molecules are diversified in this way, the reference viewing angle of the liquid crystal display may be increased.

Also, as described above, the metal conductors 121, 131, 171, and 175 are made of a low resistance metal and are thick to thereby reduce the wire resistance. The low dielectric insulating layer 140 has a low dielectric constant such that the signal delay due to an RC delay may be reduced upon driving the liquid crystal display, and the charging time of the pixel voltage may be sufficiently obtained. This is advantageous for a liquid crystal display with a large size and high resolution. Also, non-uniformity of the display may be prevented upon driving the liquid crystal display.

Next, a manufacturing method of the lower panel 100 of the liquid crystal panel assembly according to an exemplary embodiment of the present invention shown in FIG. 1, FIG. 2, and FIG. 3 will be described in detail below with reference to FIG. 4, FIG. 5, FIG. 6, FIG. 7, and FIG. 8 and FIG. 1, FIG. 2, and FIG. 3. FIG. 2 and FIG. 3 are referred to together.

FIG. 4, FIG. 5, FIG. 6, FIG. 7, and FIG. 8 are cross-sectional views taken along the lines III-III' and III'-III' in FIG. 2 that sequentially show a manufacturing method of a lower panel of the liquid crystal panel assembly shown in FIG. 1, FIG. 2, and FIG. 3 in a manufacturing process according to an exemplary embodiment of the present invention.

Figure 4:
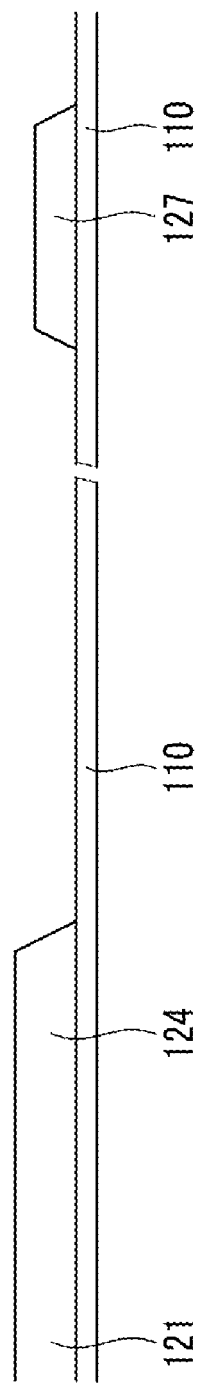
FIG. 4, FIG. 5, FIG. 6, FIG. 7, and FIG. 8 are cross-sectional views taken along lines III-III' and III'-III" of FIG. 2 that sequentially show a manufacturing method according to an exemplary embodiment of the present invention for a lower panel of the liquid crystal display shown in FIG. 1, FIG. 2, and FIG. 3.

Referring to FIG. 4, a gate conductive layer (not shown) made of a metal having low resistance, such as an aluminum-containing metal, a silver-containing metal, or a copper-containing metal, is deposited on an insulating substrate 110 of transparent glass, and is patterned by photolithography to form gate conductors including a plurality of gate lines 121. Here, a light blocking film 127 may be formed on the substrate 110 and under a storage electrode line 131 that will be formed later. The light blocking film 127 may be formed by the photolithography of the gate conductive layer. The light blocking film 127 may be made with the same pattern as the storage electrode line 131.

The deposition method of the gate conductive layer (not shown) may include sputtering, electroplating, electroless plating, Inkjet printing, or gravure printing. The thickness of the gate conductor, which comprises the gate line 121 and the gate electrode 124, may be in the range of 0.5 μm to 5 μm. Here, a lower buffer layer made of silicon nitride SiNx (not shown) may be attached to prevent bending of the substrate 110 due to stress generated when depositing the gate conductive layer.

Figure 5:
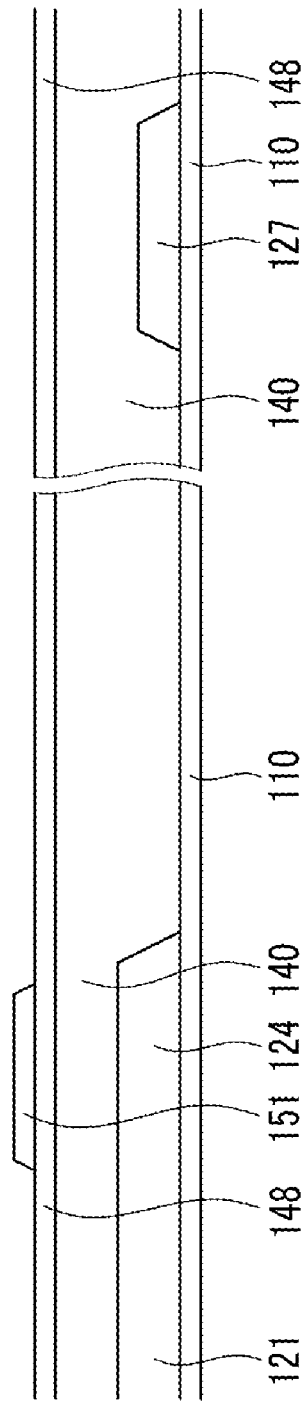

Referring to FIG. 5, a low dielectric insulating layer 140 having a good leveling characteristic is deposited at a thickness of 0.5 to 5 μm on the gate conductor and the substrate 110. Without the removal of the layer on the gate conductor it is preferable that the low dielectric insulating layer 140 is formed with a sufficient thickness on the gate conductor to produce the effect of the low dielectric ratio.

The low dielectric insulating layer 140 may be a photosensitive organic insulator such as hydrogen silsesquioxane (HSQ), methylsilsesquioxane (MSQ), polyimide, polynorbornenes (PN), benzocyclobutene, aromatic polymers, vapor-deposited parylene, parylene-F, fluorine-doped amorphous carbon, or polytetrafluoroethylene (PTFE) (i.e., Teflon®) When the deposited low dielectric insulating layer 140 is not flat, the substrate may be polished so that it is planarized. A gate insulating layer 148 may be deposited on the low dielectric insulating layer 140. The gate insulating layer 148 may be made of silicon nitride SiNx or silicon oxide SiOx.

An oxide semiconductor is deposited on the gate insulating layer 148 and patterned by photolithography to form a semiconductor layer 151. The low dielectric insulating layer 140, the gate insulating layer 148, and the oxide semiconductor may be deposited using chemical vapor deposition.

Figure 6:
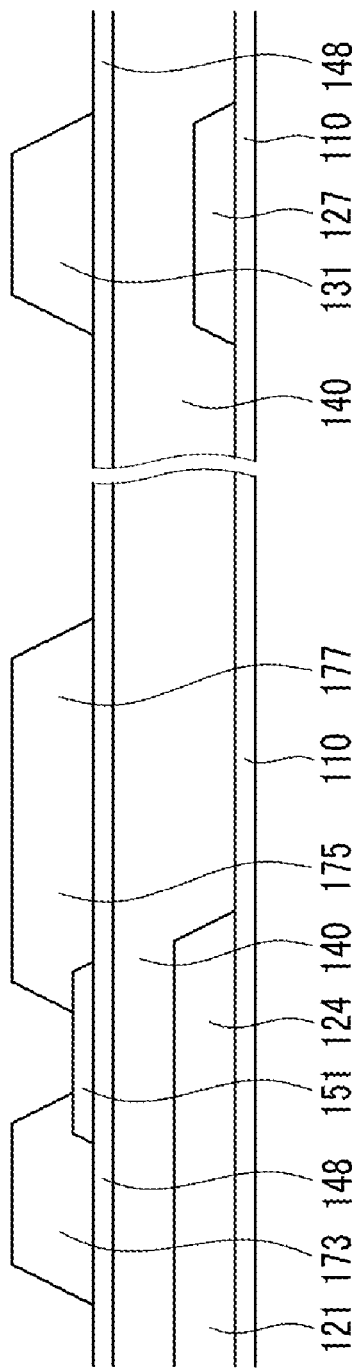

Referring to FIG. 6, a data conductive layer is deposited on the semiconductor layer 151. The data conductive layer is patterned by photolithography to expose a channel of the thin film transistor. The data conductor layer includes a plurality of data lines 171 having a plurality of source electrodes 173, a plurality of drain electrodes 175, and a plurality of storage electrode lines 131. Again referring to FIG. 2 and FIG. 3, the storage electrode lines 131 may be formed according to the longitudinal direction of the pixel area, and have a zigzag shape.

In the present exemplary embodiment, the semiconductor layers 151, the source electrodes 173, the drain electrodes 175, and the storage electrode lines 131 may be simultaneously patterned by using one mask. In this case, the data lines 171, the drain electrodes 175, the semiconductor layers 151, and the storage electrode lines 131 are formed by using one photosensitive film pattern as an etch mask such that the manufacturing process may be simplified.

Figure 7:
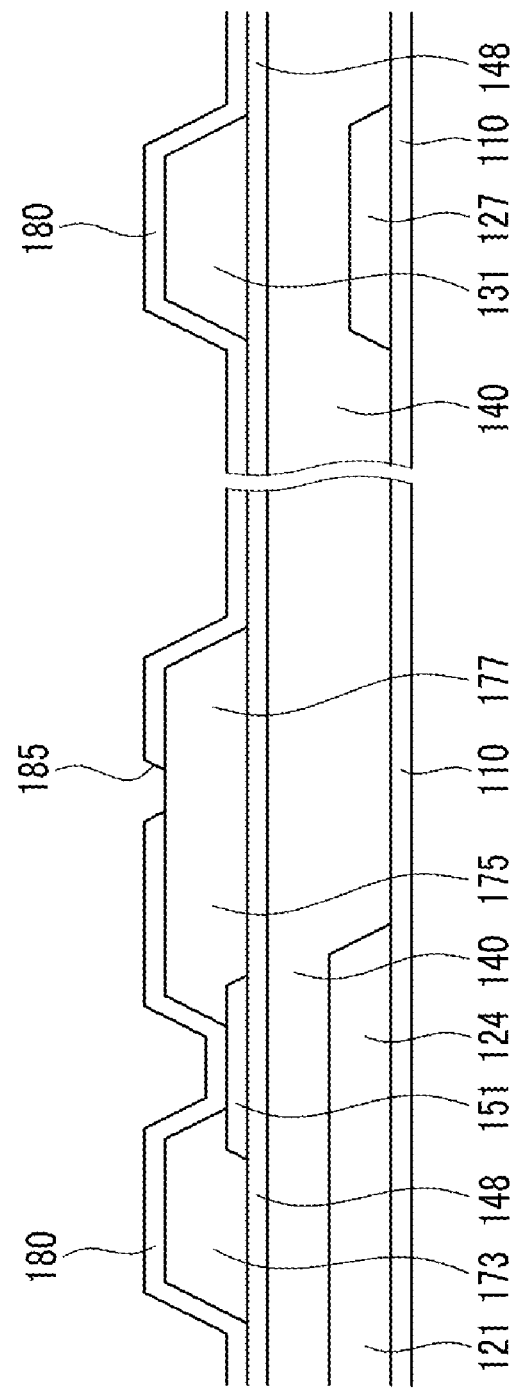

Next, as shown in FIG. 2 and FIG. 7, a passivation layer 180 of an organic insulating material or an inorganic insulating material is formed and patterned by photolithography to form a plurality of contact holes 181, 182, and 185. The gate insulating layer 148 is etched together with the passivation layer 180 to form a plurality of contact holes 181 exposing the end portions 129 of the gate lines 121. The low dielectric insulating layer 140 may be partially removed through additional etching of the contact region.

Figure 8:
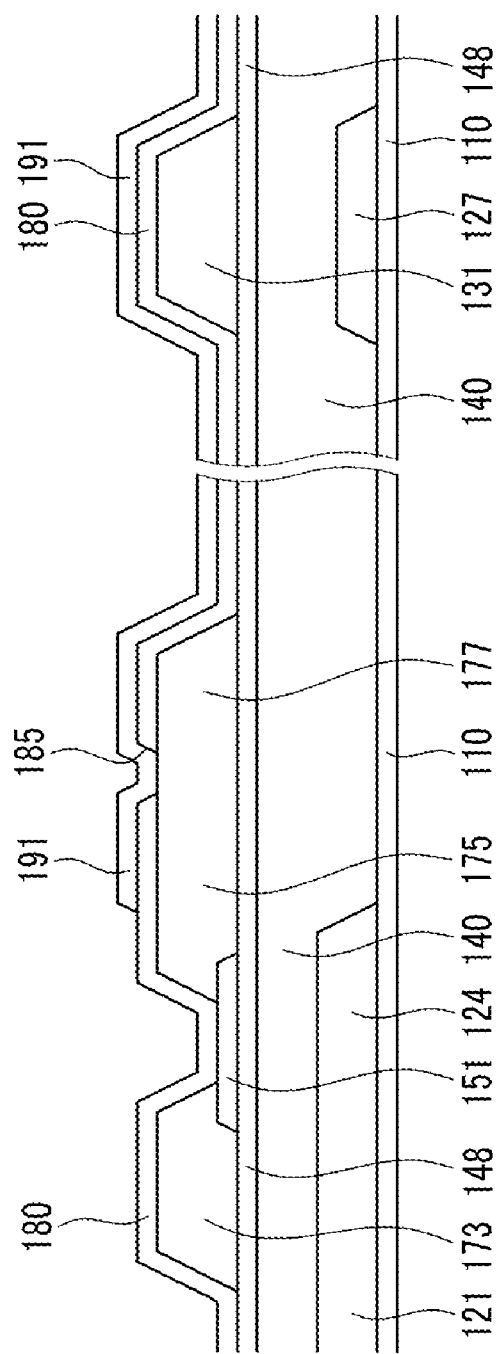

Finally, as shown in FIG. 8, an IZO layer or an ITO layer may be deposited by a sputtering method on the passivation layer 180 and patterned to form a plurality of pixel electrodes 191. As shown in FIG. 2, the pixel electrodes 191 may include the cutouts 92 and 93.

As described above, according to an exemplary embodiment of the present invention, the reduction of parasitic capacitance due to the low dielectric insulating layer may be maximized, and device production may be optimized through the reduction of tact time and device cost.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display comprising:
a first substrate;
a first conductor arranged on the first substrate;
a first insulating layer arranged on the first substrate and the first conductor;
a second insulating layer arranged on the first insulating layer;
a semiconductor layer arranged on the second insulating layer; and
a second conductor arranged on the second insulating layer, wherein the semiconductor layer comprises an oxide semiconductor and the second conductor comprises a source electrode, a drain electrode, and a storage electrode line.

2. The liquid crystal display of claim 1, wherein
the first conductor, the first insulating layer, the second insulating layer, the semiconductor layer, the source electrode, and the drain electrode form a thin film transistor; and
the source electrode, the drain electrode, and the storage electrode line are formed of the same layer.

3. The liquid crystal display of claim 2, wherein the storage electrode line extends non-linearly and in an extension direction of a data line.

4. The liquid crystal display of claim 3, further comprising:
a passivation layer arranged on the second conductor;
a pixel electrode arranged on the passivation layer; and
a common electrode arranged on a lower surface of a second substrate, the common electrode facing the first substrate,
wherein the common electrode comprises a cutout, and the storage electrode line overlaps with the cutout of the common electrode.

5. The liquid crystal display of claim 4, further comprising a light blocking film disposed between the first insulating layer and the first substrate and under the storage electrode line, the light blocking film having the same pattern as the storage electrode line.

6. The liquid crystal display of claim 1, further comprising a buffer layer arranged between the first substrate and the first conductor.

7. The liquid crystal display of claim 1, wherein a thickness of the first insulating layer is equal to or greater than a thickness of the first conductor.

8. The liquid crystal display of claim 7, wherein the thickness of the first conductor is in the range of 0.5 µm to 5 µm, and the thickness of the first insulating layer is in the range of 0.5 µm to 5 µm.

9. The liquid crystal display of claim 8, wherein the dielectric constant of the first insulating layer is less than 3.5.

10. The liquid crystal display of claim 9, wherein the first insulating layer comprises either an inorganic insulator or an organic insulator.

11. The liquid crystal display of claim 10, wherein the inorganic insulator comprises at least one of fluorine-doped silicon oxide ($SiO_2F$), carbon-doped silicon oxide ($SiO_2C$), hydrogen-doped silicon oxide ($SiO_2H$), porous silicon oxide (porous $SiO_2$), porous carbon silicon oxide (porous $SiO_2C$), and highly porous oxides.

12. The liquid crystal display of claim 10, wherein the organic insulator comprises at least one of hydrogen silsesquioxane (HSQ), methylsilsesquioxane, polyimide, polynorbornenes, benzocyclobutene, aromatic polymers, vapor-deposited parylene, parylene-F, fluorine doped amorphous carbon, and polytetrafluoroethylene (PTFE).

13. The liquid crystal display of claim 9, wherein the oxide semiconductor of the semiconductor layer comprises at least one of Zn oxide, Ga oxide, Sn oxide, In oxide, $InGaZnO_4$, Zn—In—O, and Zn—Sn—O.

14. The liquid crystal display of claim 1, wherein the first conductor or the second conductor comprises of aluminum (Al), silver (Ag), and copper (Cu).

* * * * *